(12) United States Patent
Chen et al.

(10) Patent No.: US 11,664,667 B2
(45) Date of Patent: May 30, 2023

(54) BATTERY DETECTION DEVICE

(71) Applicant: Compal Electronics, Inc., Taipei (TW)

(72) Inventors: Huang-Chih Chen, Taipei (TW); Chen-Hao Lan, Taipei (TW); Yueh-Hsiang Chen, Taipei (TW)

(73) Assignee: COMPAL ELECTRONICS, INC., Taipei (TW)

( * ) Notice: Subject to any disclaimer, the term of this patent is extended or adjusted under 35 U.S.C. 154(b) by 39 days.

(21) Appl. No.: 17/538,524

(22) Filed: Nov. 30, 2021

(65) Prior Publication Data

US 2023/0049728 A1     Feb. 16, 2023

(30) Foreign Application Priority Data

Aug. 12, 2021 (TW) .................................. 110129830

(51) Int. Cl.
    *H02J 7/00*                (2006.01)
    *H02H 1/00*               (2006.01)
    (Continued)

(52) U.S. Cl.
    CPC .......... *H02J 7/0029* (2013.01); *G01R 31/389* (2019.01); *H02H 1/0007* (2013.01);
    (Continued)

(58) Field of Classification Search
    CPC ........ H02J 7/0029; H02J 7/005; H02J 7/0063; H02H 1/0007; H02H 3/20; H02H 7/18; G01R 31/389; Y02E 60/10; H03F 3/45
    (Continued)

(56) References Cited

U.S. PATENT DOCUMENTS 8,717,186 B2    5/2014    Zhou
9,917,335 B2    3/2018    Jarvis et al.
(Continued)

FOREIGN PATENT DOCUMENTS

CN      104485490 A      4/2015
CN      103812090 B      8/2017
(Continued)

OTHER PUBLICATIONS

Machine translation of Ito Japanese Patent Document JP 2000-340264 A Dec. 2000 (Year: 2000).*

*Primary Examiner* — Kevin J Comber
(74) *Attorney, Agent, or Firm* — Kirton McConkie; Evan R. Witt

(57) ABSTRACT

The present disclosure provides a battery detection device. The detection circuit is disposed on the battery and produces an impedance value variation quantity according to a deformation of the battery. The detection circuit includes four connection nodes. The first connection node and the third connection node are connected with the battery. A voltage variation quantity is produced between the second connection node and the fourth connection node according to the impedance value variation quantity. The protection circuit is connected with the second connection node and the fourth connection node. The protection circuit is in an ON state when the voltage variation quantity is greater than or equal to a cut-off voltage. The protection circuit is in an OFF state when the voltage variation quantity is less than the cut-off voltage, so that an operation state of the battery is changed accordingly.

16 Claims, 15 Drawing Sheets

(51) Int. Cl.
  *H02H 7/18* (2006.01)
  *G01R 31/389* (2019.01)
  *H02H 3/20* (2006.01)
  *H03F 3/45* (2006.01)

(52) U.S. Cl.
  CPC ............... *H02H 3/20* (2013.01); *H02H 7/18* (2013.01); *H02J 7/005* (2020.01); *H02J 7/0063* (2013.01); *H03F 3/45* (2013.01)

(58) Field of Classification Search
  USPC ...................................................... 361/91.2
  See application file for complete search history.

(56) References Cited

U.S. PATENT DOCUMENTS

| | | | |
|---|---|---|---|
| 10,923,776 B2 | 2/2021 | Spare et al. | |
| 2005/0084754 A1* | 4/2005 | Klein | H01M 10/34 |
| | | | 429/61 |
| 2016/0209473 A1 | 7/2016 | You et al. | |
| 2020/0203783 A1 | 6/2020 | Ringuette et al. | |

FOREIGN PATENT DOCUMENTS

| | | |
|---|---|---|
| CN | 213238767 U | 5/2021 |
| JP | 2000340264 A * | 12/2000 |
| JP | 2000340264 A | 12/2000 |
| TW | I560463 B | 12/2016 |
| TW | 202004208 A | 1/2020 |
| TW | 202016557 A | 5/2020 |
| TW | 202040152 A | 11/2020 |

\* cited by examiner

BATTERY DETECTION DEVICE

CROSS-REFERENCE TO RELATED APPLICATION

This application claims priority to Taiwan Patent Application No. 110129830 filed on Aug. 12, 2021, the entire contents of which are incorporated herein by reference for all purposes.

FIELD OF THE INVENTION

The present disclosure relates to a battery, and more particularly to a battery detection device.

BACKGROUND OF THE INVENTION

Usually, battery provides power to mobile device or electronic device without connecting with an electric power system. Safety of the battery is related to safety of the user directly. With the current design of the battery, the possibility of sudden explosion of the battery is pretty low. However, the user cannot confirm the deformation of the battery directly. The main body of the battery and the system applied for the battery also cannot detect the deformation of the battery directly. Once the battery continues to deform and the casing of the battery bursts, the fire accident will happen. Consequently, when the battery is utilized, it is necessary to warm the user to stop using the battery or control the battery not to supply power to the load as the deformation of the battery occurs.

The conventional method for detecting the deformation of the battery includes utilizing hardware or firmware to detect the deformation of the battery. The conventional method of utilizing hardware to detect the deformation of the battery is to dispose a pressure detector on the battery. When the battery is deformed and abuts against the casing of the electronic device, the external controller determines whether the pressure sensed by the pressure detector is greater than a preset threshold. If the determining result is satisfied, the external controller outputs an abnormal signal to the processor of the electronic device to control the operation of the battery. However, the precision of the pressure detector is worse. The preset threshold of the abnormal signal is not easy to set. The pressure detector is invalid easily when the variation of the temperature difference is increased. Moreover, the pressure detector may not detect the battery properly when the casing supporting the pressure detector is deformed.

The conventional method of utilizing firmware to detect the deformation of the battery is to dispose a capacitance pressure detector in the battery. By detecting whether the capacitance value of the capacitance pressure detector is greater than a preset threshold through an external module, the operation of the battery is controlled. However, it is difficult to calibrate the capacitance pressure detector. The output of the capacitance pressure detector is affected by the external material of the capacitance pressure detector. Moreover, the manipulation of the capacitance pressure detector is complicated, the cost of the capacitance pressure detector is increased and the assembling tolerance of the capacitance pressure detector is increased. Furthermore, with the conventional battery deformation detection method utilizing hardware and firmware, the battery must be controlled through the system and cannot achieve detection and protection of the battery in the state of only battery cells.

Therefore, there is a need of providing a battery detection device in order to address the above issues encountered by the prior arts.

SUMMARY OF THE INVENTION

The present disclosure provides a battery detection device. The battery detection device is capable of increasing precision, being calibrated easily, manipulating easily, decreasing cost and decreasing the assembling tolerance.

In accordance with an aspect of the present disclosure, a battery detection device is provided. The battery detection device is applied to a battery. The battery includes a positive terminal and a negative terminal and provides a power to a load. The battery detection device includes a detection circuit and a protection circuit. The detection circuit is disposed on the battery and produces a first impedance value variation quantity according to a deformation of the battery. The detection circuit includes a first connection node, a second connection node, a third connection node and a fourth connection node. The first connection node and the third connection node are electrically connected with the positive terminal and the negative terminal, respectively, for receiving the power provided by the battery. A voltage variation quantity is produced between the second connection node and the fourth connection node at least according to the first impedance value variation quantity. The protection circuit is connected with the second connection node and the fourth connection node. The protection circuit is in an ON state when the voltage variation quantity is greater than or equal to a cut-off voltage. The protection circuit is in an OFF state when the voltage variation quantity is less than the cut-off voltage, so that an operation state of the battery is changed accordingly.

The above contents of the present disclosure will become more readily apparent to those ordinarily skilled in the art after reviewing the following detailed description and accompanying drawings, in which:

DETAILED DESCRIPTION OF THE PREFERRED EMBODIMENT

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed.

Figure 1:
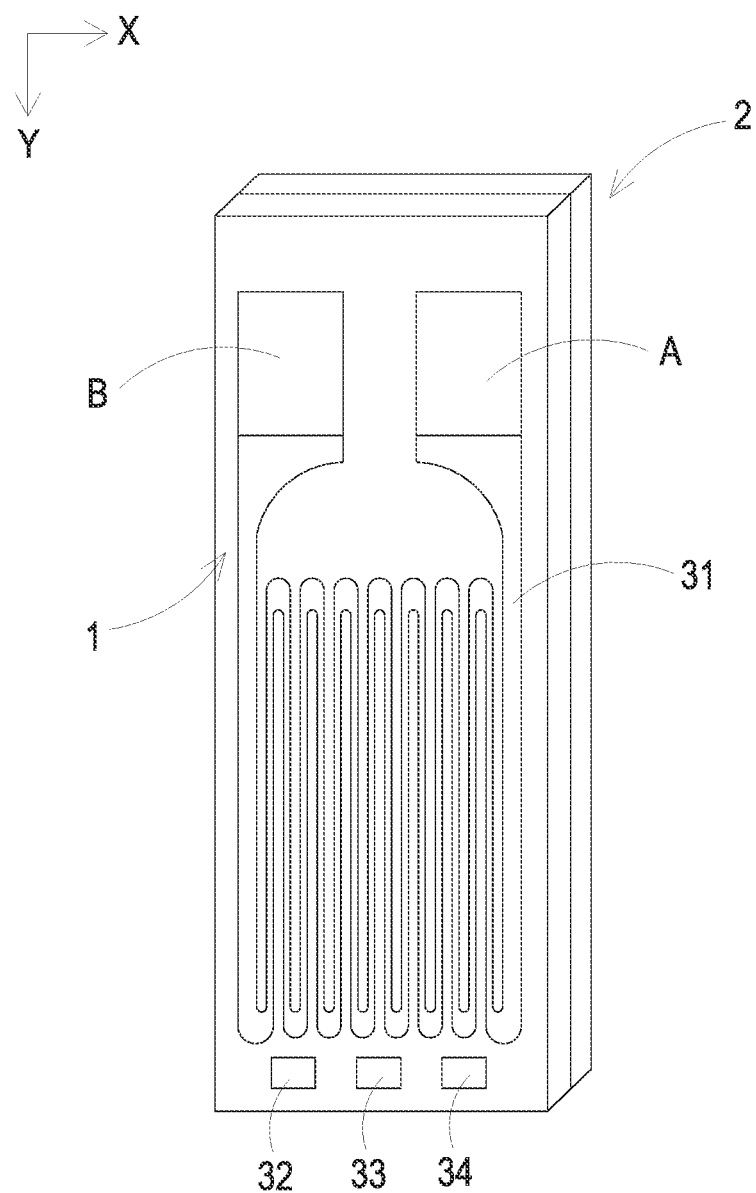
FIG. 1 is a schematic perspective view illustrating a battery detection device according to a first embodiment of the present disclosure, which is applied to a battery.
Figure 2:
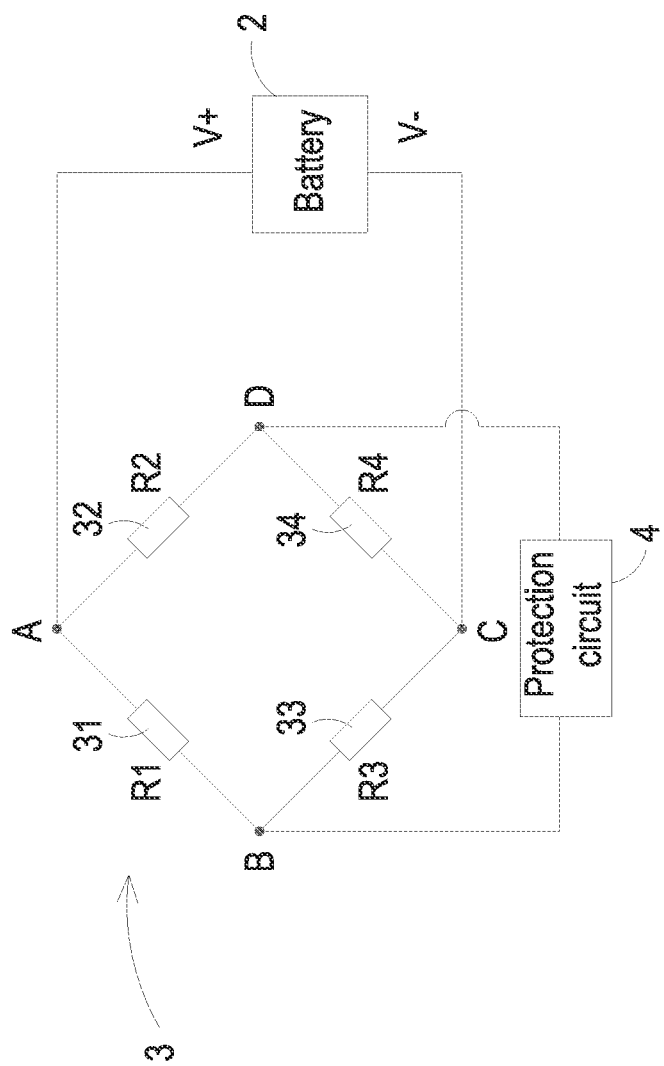
FIG. 2 is a circuit diagram illustrating the battery detection device of FIG. 1, which is applied to the battery in a normal state.
Figure 3:
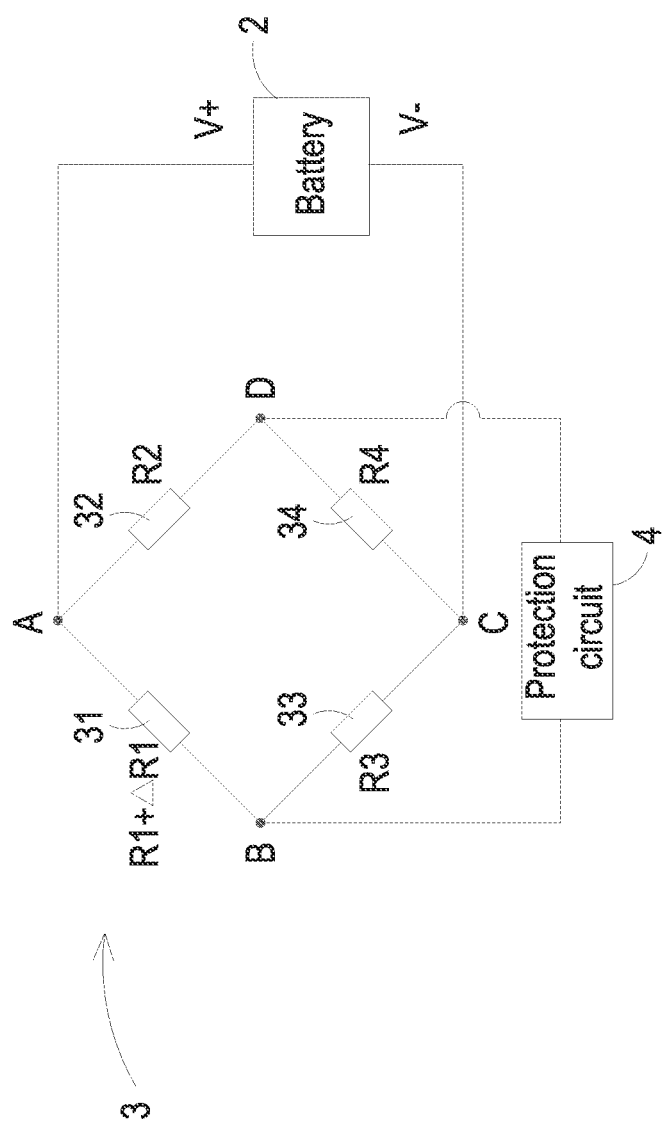
FIG. 3 is a circuit diagram illustrating the battery detection device of FIG. 1, which is applied to the battery in a deformation state.

FIG. 1 is a schematic perspective view illustrating a battery detection device according to a first embodiment of the present disclosure, which is applied to a battery. FIG. 2 is a circuit diagram illustrating the battery detection device of FIG. 1, which is applied to the battery in a normal state. FIG. 3 is a circuit diagram illustrating the battery detection device of FIG. 1, which is applied to the battery in a deformation state. As shown in FIGS. 1 to 3, the battery detection device 1 is applied to a battery 2 disposed within an electronic device. The battery 2 has a positive terminal V+ and a negative terminal V−, and provides an electric power to a load (not shown). The battery detection device 1 includes a detection circuit 3 and a protection circuit 4. In this embodiment, the detection circuit 3 is disposed on a surface of the battery 2. The detection circuit 3 and the battery 2 are integrally formed into one piece. The detection circuit 3 includes a first resistor 31, a second resistor 32, a third resistor 33 and a fourth resistor 34. The first resistor 31 is disposed on the surface of the battery 2 and served as a stress detector of the battery detection device 1. The first resistor 31 is extended in a first direction Y. In this embodiment, the first resistor 31 is a long and thin conductive strip including at least one straight portion and at least one curved portion which are connected sequentially. Preferably but not exclusively, the long and thin conductive strip is an extendable conductor, such as gold, silver, copper, iron or aluminum. Probably, the long and thin conductive strip is made of the material applied to curved touch panel, such as metal mesh material or SNT nanosilver, but not limited thereto. The impedance value R1 of the first resistor 31 produces a first impedance value variation quantity $\Delta R1$ according to the deformation of the battery 2 in the first direction Y. The relationship between the impedance value R1 of the first resistor 31 and the deformation of the battery 2 is described in FIGS. 4 and 5 below.

Figure 4:
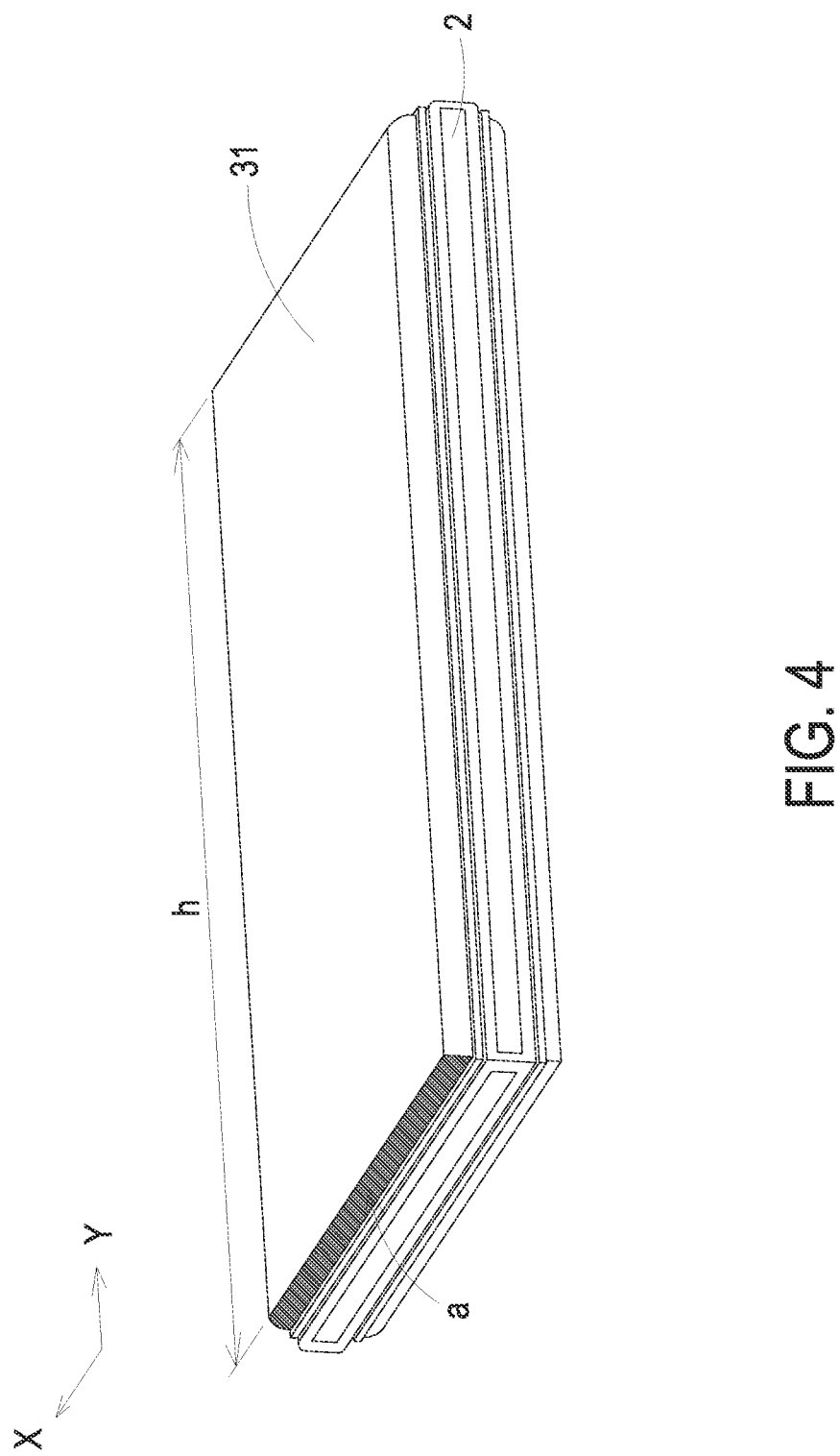
FIG. 4 is a schematic perspective view illustrating the battery detection device of FIG. 1, which is applied to the battery in the normal state.
Figure 5:
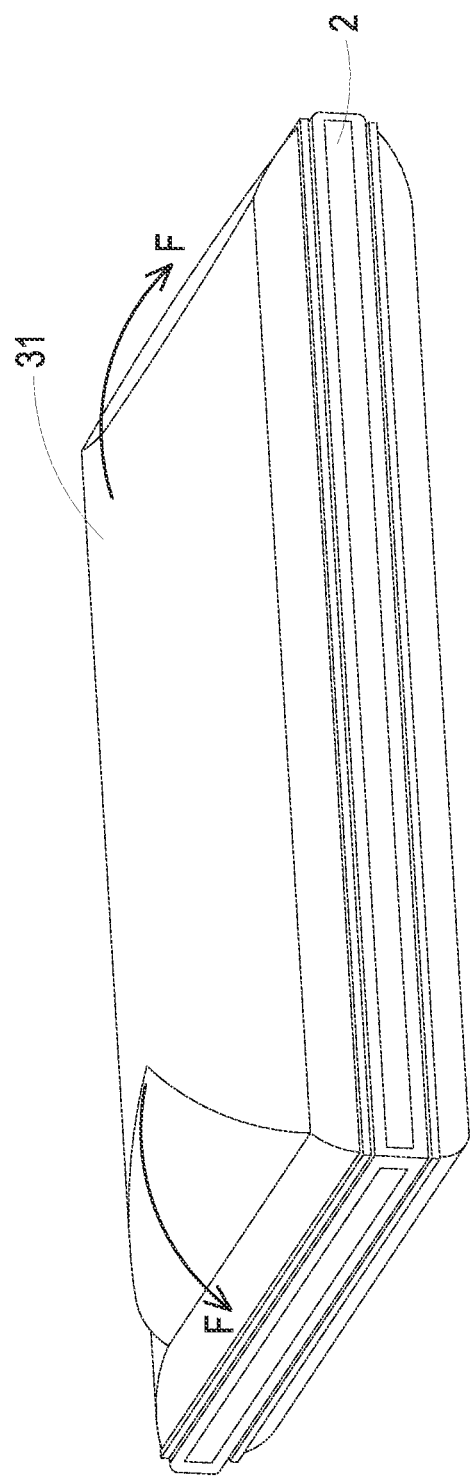
FIG. 5 is a schematic perspective view illustrating the battery detection device of FIG. 1, which is applied to the battery in the deformation state.

FIG. 4 is a schematic perspective view illustrating the battery detection device of FIG. 1, which is applied to the battery in the normal state. FIG. 5 is a schematic perspective view illustrating the battery detection device of FIG. 1, which is applied to the battery in the deformation state. For ease of description, the first resistor 31 of FIGS. 4 and 5 is a sheet structure and disposed on the surface of the battery 2, and the second resistor 32, the third resistor 33 and the fourth resistor 34 are omitted in FIGS. 4 and 5. As shown in FIG. 4, the label h is represented as the length of the first resistor 31, and the label a is represented as the cross section area of the first resistor 31. Certainly, the shape of the first resistor 31 is not limited. When the battery 2 is in the normal state (i.e., the battery 2 has no deformation), as shown in FIG. 4, the first resistor 31 disposed on the surface of the battery 2 has no deformation. When the battery 2 is in the normal state, the impedance value R1 of the first resistor 31 is equal to the impedance rate of the first resistor 31 multiplied by the length h of the first resistor 31, and divided by the cross section area a of the first resistor 31. When the battery 2 is deformed in the first direction Y or the second direction X, as shown in FIG. 5, a deformation force F is produced on the battery 2 in the first direction Y or the second direction X, the length h of the first resistor 31 disposed on the surface of the battery 2 is increased, so that the impedance value of the first resistor 31 is increased to $R1+\Delta R1$ when the battery 2 is deformed. $\Delta R1$ is a first impedance value variation quantity related to the deformation of the battery 2, that means the impedance value of the first resistor 31 is increased when the battery 2 is deformed in the first direction Y or the second direction X.

Please refer to FIGS. 1, 2 and 3 again, the second resistor 32 is disposed on the surface of the battery 2. In this embodiment, the impedance value R2 of the second resistor 32 is fixed. The connection between the second resistor 32 and the first resistor 31 is formed as a first connection node A, as shown in FIGS. 2 and 3. In some embodiments, the second resistor 32 is a fixed resistor disposed on the battery 2, but not an additional resistor. The third resistor 33 is disposed on the surface of the battery 2. In this embodiment, the impedance value R3 of the third resistor 33 is fixed. The connection between the third resistor 33 and the first resistor 31 is formed as a second connection node B, as shown in FIGS. 2 and 3. In some embodiments, the third resistor 33 is a fixed resistor disposed on the battery 2, but not an additional resistor. The fourth resistor 34 is disposed on the surface of the battery 2. In this embodiment, the impedance value R4 of the fourth resistor 34 is fixed. As shown in FIGS. 2 and 3, the connection between one end of the fourth resistor 34 and the third resistor 33 is formed as a third connection node C, and the connection between the other end of the fourth resistor 34 and the second resistor 32 is formed as a fourth connection node D. In some embodiments, the fourth resistor 34 is a fixed resistor disposed on the battery 2, but not an additional resistor. The first connection node A and the third connection node C are electrically connected to the positive terminal V+ and the negative terminal V− respectively for receiving the power provided from the battery 2, for example the output voltage of the battery 2. A voltage variation quantity is produced between the second connection node B and the fourth connection node D according to the first impedance value variation quantity $\Delta R1$.

The protection circuit 4 is connected with the second connection node B and the fourth connection node D of the detection circuit 3. When the voltage variation quantity between the second connection node B and the fourth connection node D is greater than or equal to a cut-off voltage, the protection circuit 4 is in an ON state. When the voltage variation quantity between the second connection node B and the fourth connection node D is less than the cut-off voltage, the protection circuit 4 is in an OFF state. In this embodiment, the protection circuit 4 is connected between the battery 2 and the load. The switching operation between the ON state and the OFF state of the protection circuit 4 changes the operation state of the battery 2 accordingly, so that the battery 2 provides the power to the load or not accordingly.

When the battery 2 is in the normal state, as shown in FIG. 2, the ratio between the impedance value R1 of the first resistor 31 and the impedance value R3 of the third resistor 33 is equal to the ratio between the impedance value R2 of the second resistor 32 and the impedance value R4 of the fourth resistor 34. Therefore, the electric bridge formed by the first resistor 31, the second resistor 32, the third resistor 33 and the fourth resistor 34 achieves balance. The operation equation of the voltage variation quantity between the second connection node B and the fourth connection node D is $$\Delta V_o = \left( \frac{R1}{R1 + R3} - \frac{R2}{R2 + R4} \right) Vin,$$

wherein $\Delta V_o$ is the voltage variation quantity, and Vin is the voltage provided by the battery 2. From above, the voltage variation quantity between the second connection node B and the fourth connection node D is zero. Therefore, the electric bridge does not output any voltage. The protection circuit 4 is maintained in the OFF state, so that the battery 2 provides power to the load continuously. In some embodiments, the impedance value R2 of the second resistor 32, the impedance value R3 of the third resistor 33 and the impedance value R4 of the fourth resistor 34 are variable to adjust the error. When the battery 2 is in the normal state, the voltage variation quantity between the second connection node B and the fourth connection node D is controlled as zero.

When the battery 2 is deformed, the impedance value of the first resistor 31 is increased to R1+ΔR1, as shown in FIG. 3. The ratio between the impedance value R1+ΔR1 of the first resistor 31 and the impedance value R3 of the third resistor 33 is not equal to the ratio between the impedance value R2 of the second resistor 32 and the impedance value R4 of the fourth resistor 34. Therefore, the electric bridge formed by the first resistor 31, the second resistor 32, the third resistor 33 and the fourth resistor 34 does not achieve balance. The operation equation of the voltage variation quantity between the second connection node B and the fourth connection node D is $$\Delta V_o = \left( \frac{R1 + \Delta R1}{R1 + \Delta R1 + R3} - \frac{R2}{R2 + R4} \right) Vin,$$

wherein $\Delta V_o$ is the voltage variation quantity, and Vin is the voltage provided by the battery 2. From above, the voltage variation quantity between the second connection node B and the fourth connection node D is not zero. Moreover, when the voltage variation quantity between the second connection node B and the fourth connection D is greater than or equal to the cut-off voltage of the protection circuit 4, the protection circuit 4 is in the ON state, so that the battery 2 cannot provide the voltage to the load.

From above, the battery detection device 1 of this embodiment includes a first resistor 31, a second resistor 32, a third resistor 33, a fourth resistor 34 and a protection circuit 4. According to the connection between the first resistor 31, the second resistor 32, the third resistor 33 and the fourth resistor 34, the battery detection device 1 changes the voltage variation quantity between the second connection node B and the fourth connection node D according to the impedance value variation of the first resistor 31 when the battery 2 is deformed. The working state of the protection circuit 4 is controlled, so that the operation state of the battery 2 is controlled. Consequently, the battery detection device 1 controls the operation state of the battery 2 according to the stress produced by the deformation of the battery 2 in the deformation state. Compared to the conventional battery deformation detection method utilizing the pressure detector, the precision of the battery detection device 1 is increased. The battery detection device 1 does not need to set a threshold for an abnormal signal. The battery detection device 1 is valid when the variation of the temperature difference is increased. Moreover, compared to the conventional battery deformation detection method utilizing the capacitance pressure detector, the battery detection device 1 has advantages of increasing precision, being calibrated easily, manipulating easily, decreasing cost and decreasing the assembling tolerance.

In some embodiments, the second connection node B and the fourth connection node D are connected with a display device, such as a LED or a display unit. When the display device receives the voltage variation quantity ΔVo between the second connection node B and the fourth connection node D, the display device reflects the voltage variation quantity ΔVo accordingly. For example, the display device is shined to warm the user that the battery 2 is in the deformation state. In some embodiments, the second connection node B and the fourth connection node D are connected with a management system (not shown) disposed within the electronic device. The management system manages the health state of the battery 2 according to the voltage variation quantity ΔVo between the second connection node B and the fourth connection node D. Consequently, the management system notifies the user about the health state of the battery 2, or stops the charging of the battery 2.

Figure 6:
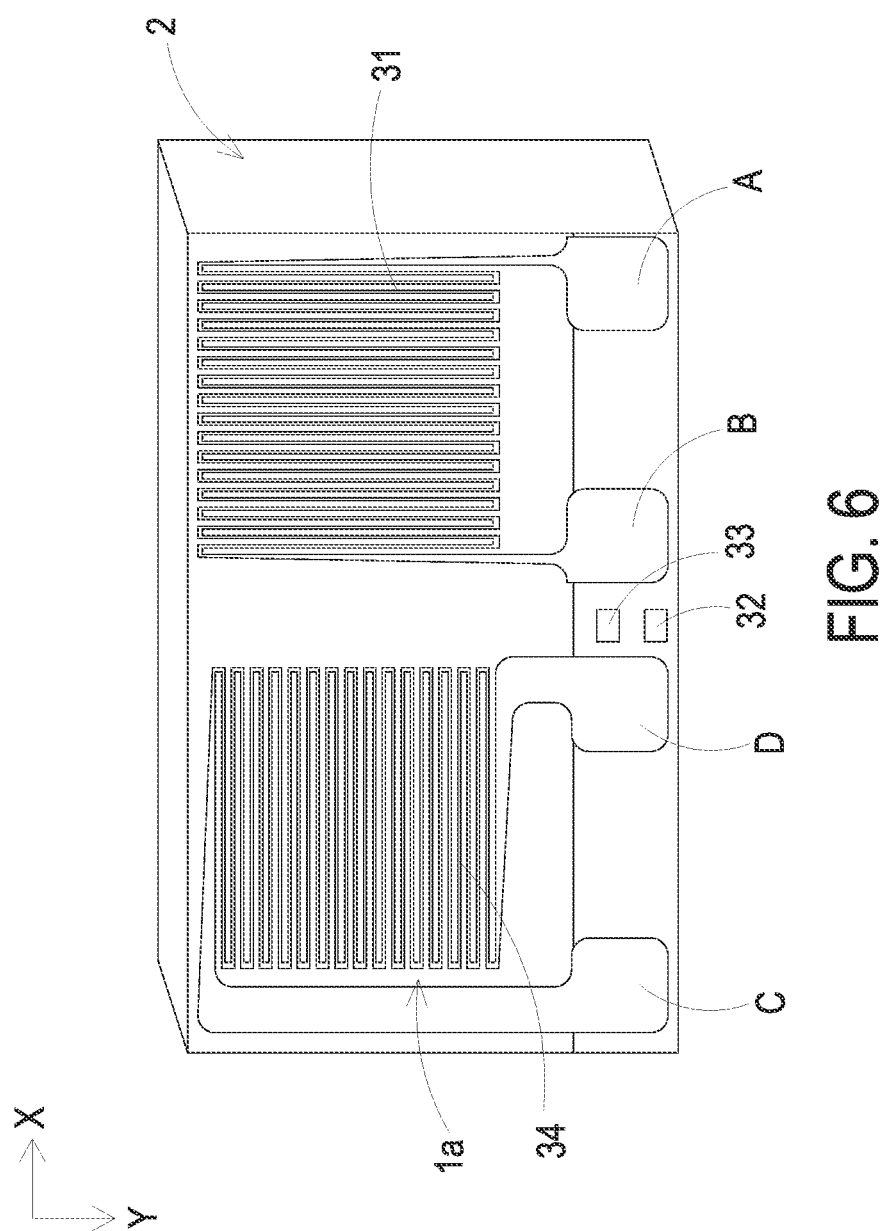
FIG. 6 is a schematic perspective view illustrating a battery detection device according to a second embodiment of the present disclosure, which is applied to a battery.
Figure 7:
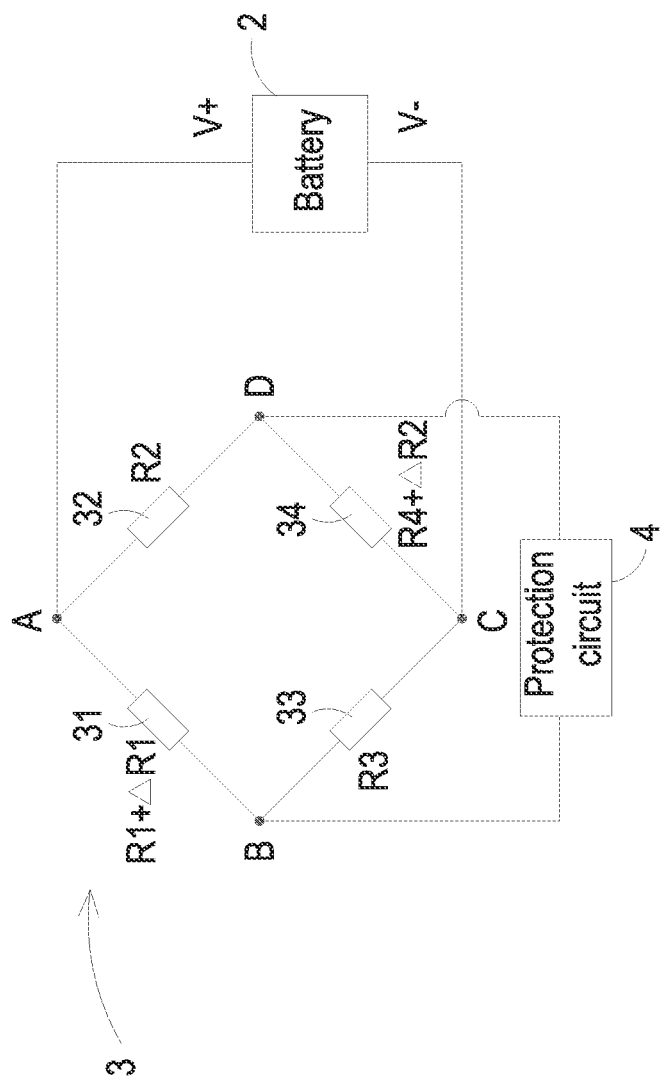
FIG. 7 is a circuit diagram illustrating the battery detection device of FIG. 6, which is applied to the battery in the deformation state.

In some embodiments, the battery detection device 1 not only detects the deformation in single axis direction (i.e., the first direction Y shown in FIG. 1), but also detects the deformation in dual axis directions. FIG. 6 is a schematic perspective view illustrating a battery detection device according to a second embodiment of the present disclosure, which is applied to a battery. FIG. 7 is a circuit diagram illustrating the battery detection device of FIG. 6, which is applied to the battery in the deformation state. Compared to the battery detection device 1 of FIG. 1, the battery detection device 1a of this embodiment includes two stress detectors. The first resistor 31 is served as one stress detector, and the fourth resistor 34 is served as the other stress detector. The fourth resistor 34 is extended in the second direction X. In this embodiment, the fourth resistor 34 is a long and thin conductive strip including at least one straight portion and at least one curved portion which are connected sequentially. Preferably but not exclusively, the long and thin conductive strip is an extendable conductor, such as gold, silver, copper, iron or aluminum. Probably, the long and thin conductive strip is made of the material applied to curved touch panel, such as metal mesh material or SNT nano silver. The impedance value R1 of the first resistor 31 produces a first impedance value variation quantity ΔR1 according to the deformation of the battery 2 in the first direction Y. The impedance value R4 of the fourth resistor 34 produces a second impedance value variation quantity $\Delta R_2$ according to the deformation of the battery 2 in the second direction X. The battery detection device 1a detects the deformation of the battery 2 in two axis directions, such as the deformations of the battery 2 in the first direction Y and the second direction X.

When the battery 2 is deformed, the impedance value of the first resistor 31 is increased to R1+ΔR1, and the impedance value of the fourth resistor 34 is increased to R4+ΔR$_2$, as shown in FIG. 7. The ratio between the impedance value R1+ΔR1 of the first resistor 31 and the impedance value R3 of the third resistor 33 is not equal to the ratio between the impedance value R2 of the second resistor 32 and the impedance value R4+ΔR$_2$ of the fourth resistor 34. Therefore, the electric bridge formed by the first resistor 31, the second resistor 32, the third resistor 33 and the fourth resistor 34 does not achieve balance. The operation equation of the voltage variation quantity between the second connection node B and the fourth connection node D is $$\Delta V_o = \left( \frac{R1 + \Delta R1}{R1 + \Delta R1 + R3} - \frac{R2}{R2 + R4 + \Delta R2} \right) Vin,$$

wherein $\Delta V_o$ is the voltage variation quantity, and Vin is the voltage provided by the battery 2. From above, the voltage variation quantity between the second connection node B and the fourth connection node D is not zero. Moreover, when the voltage variation quantity between the second connection node B and the fourth connection node D is greater than or equal to the cut-off voltage of the protection circuit 4, the protection circuit 4 is in the ON state, so that the battery 2 cannot provide the voltage to the load.

Certainly, the extension direction of the first resistor 31 is not limited to the first direction Y, and the extension direction of the fourth resistor 34 is not limited to the second direction X. The extension direction of the resistor can be adjusted according to the practical requirements to detect the deformation in different direction, and are not redundantly described hereinafter.

Figure 8:
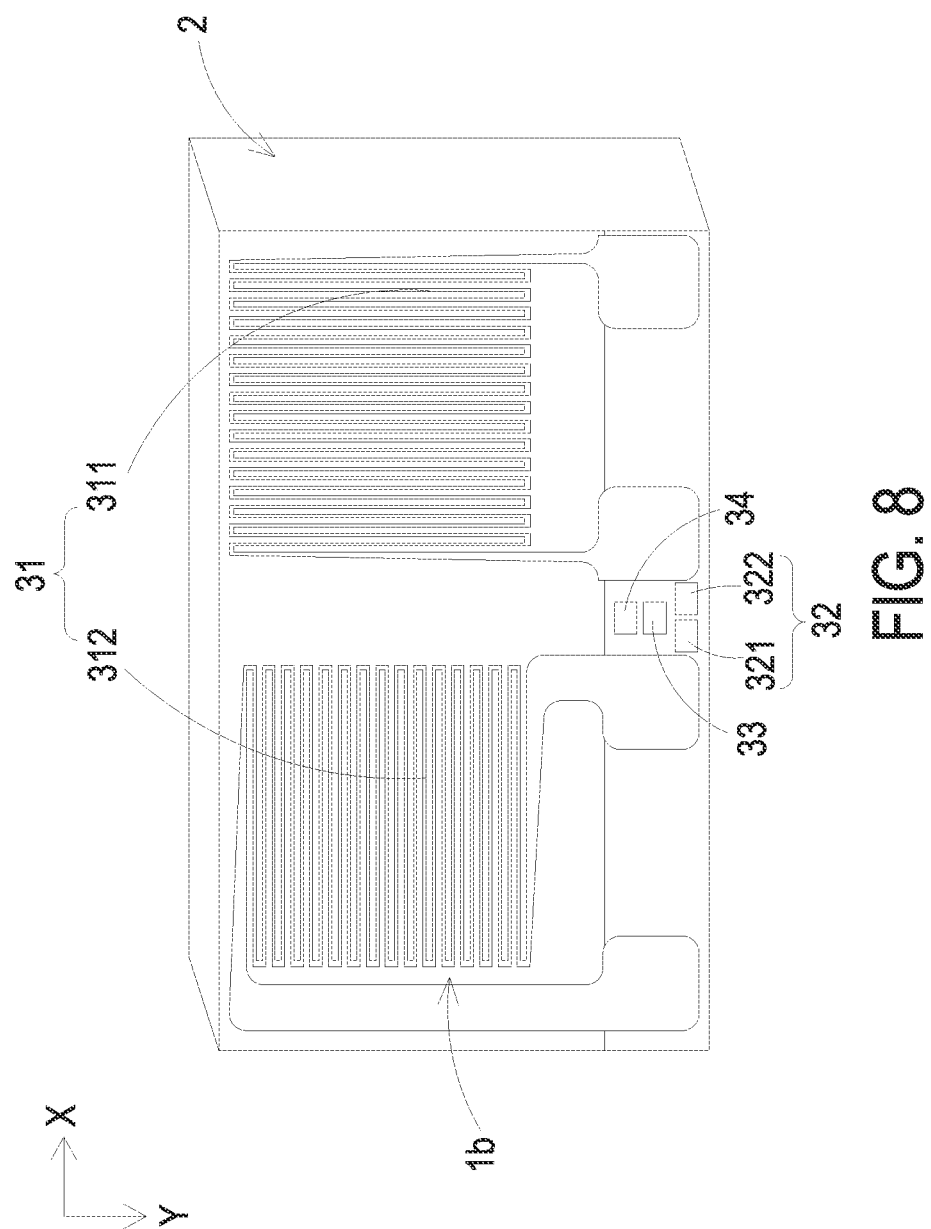
FIG. 8 is a schematic perspective view illustrating a battery detection device according to a third embodiment of the present disclosure, which is applied to a battery.
Figure 9:
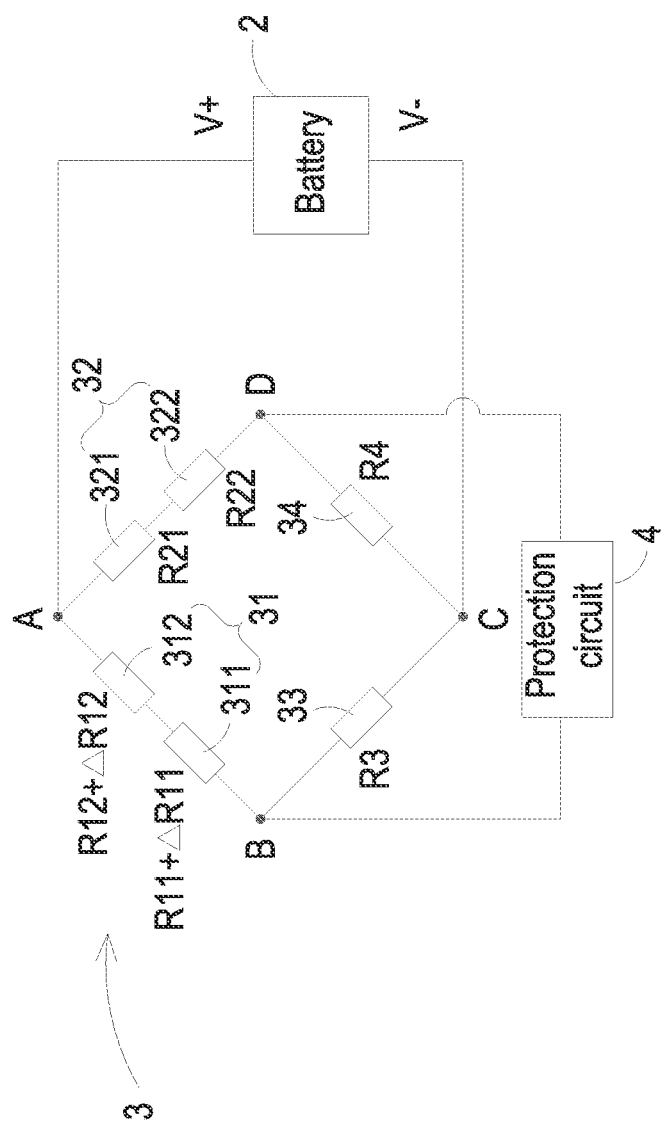
FIG. 9 is a circuit diagram illustrating the battery detection device of FIG. 8, which is applied to the battery in the deformation state.

FIG. 8 is a schematic perspective view illustrating a battery detection device according to a third embodiment of the present disclosure, which is applied to a battery. FIG. 9 is a circuit diagram illustrating the battery detection device of FIG. 8, which is applied to the battery in the deformation state. Compared to the battery detection device 1 of FIG. 1, the first resistor 31 of the battery detection device 1b of this embodiment further includes a first sub resistor 311 and a second sub resistor 312. The first sub resistor 311 is extended in the first direction Y. The second sub resistor 312 is extended in the second direction X. In the circuit diagram, as shown in FIG. 9, the first sub resistor 311 and the second sub resistor 312 are connected between the first connection node A and the second connection node B in series.

As shown in FIG. 8, the impedance value R11 of the first sub resistor 311 produces a first sub impedance value variation quantity ΔR11 according to the deformation of the battery 2 in the first direction Y. The impedance value R12 of the second sub resistor 312 produces a second sub impedance value variation quantity ΔR12 according to the deformation of the battery 2 in the second direction X. The first sub impedance value variation quantity ΔR11 and the second sub impedance value variation quantity ΔR12 are formed to the first impedance value variation quantity ΔR1 of the first resistor 31 collectively, so that the battery detection device 1b of this embodiment detects the deformation of the battery 2 in two axis directions (i.e., the deformation in the first direction Y and the deformation in the second direction X). In this embodiment, the second resistor 32 of the battery detection device 1b includes a third sub resistor 321 and a fourth sub resistor 322. In the circuit diagram, as shown in FIG. 9, the third sub resistor 321 and the fourth sub resistor 322 are connected between the first connection node A and the fourth connection node D in series.

When the battery 2 is deformed, the impedance value of the first sub resistor 311 is increased to R11+ΔR11, and the impedance value of the second sub resistor 312 is increased to R12+ΔR12, as shown in FIG. 9. The ratio between the impedance value of the first resistor 31 (i.e., sum of the impedance value R11+ΔR11 of the first sub resistor 311 and the impedance value R12+ΔR12 of the second sub resistor 312) and the impedance value R3 of the third resistor 33 is not equal to the ratio between the impedance value R2 of the second resistor 32 (i.e., sum of the impedance value R21 of the third sub resistor 321 and the impedance value R22 of the fourth sub resistor 322) and the impedance value R4 of the fourth resistor 34. Therefore, the electric bridge formed by the first resistor 31, the second resistor 32, the third resistor 33 and the fourth resistor 34 does not achieve balance. The operation equation of the voltage variation quantity between the second connection node B and the fourth connection node D is $$\Delta V_o = \left( \frac{R11 + R12 + \Delta R11 + \Delta R12}{R11 + R12 + \Delta R11 + \Delta R12 + R3} - \frac{R21 + R22}{R21 + R22 + R4} \right) Vin,$$

wherein $\Delta V_o$ is the voltage variation quantity, and Vin is the voltage provided by the battery 2. From above, the voltage variation quantity between the second connection node B and the fourth connection node D is not zero. Moreover, when the voltage variation quantity between the second connection node B and the fourth connection node D is greater than or equal to the cut-off voltage of the protection circuit 4, the protection circuit 4 is in the ON state, so that the battery 2 cannot provide the voltage to the load.

Certainly, in some embodiments, the first resistor of the battery detection device includes more sub resistors to detect the deformation of the battery in different directions. Moreover, the sub resistors disposed between the first connection node A and the fourth connection node D are simplified to utilize single resistor or variable resistor through the sum of the sub resistors connected between the first connection node A and the second connection node B. It has the same design principle that the second connection node B and the fourth connection node D do not output voltage (i.e., the electric bridge is balanced) when the battery is in the normal state.

Figure 10A:
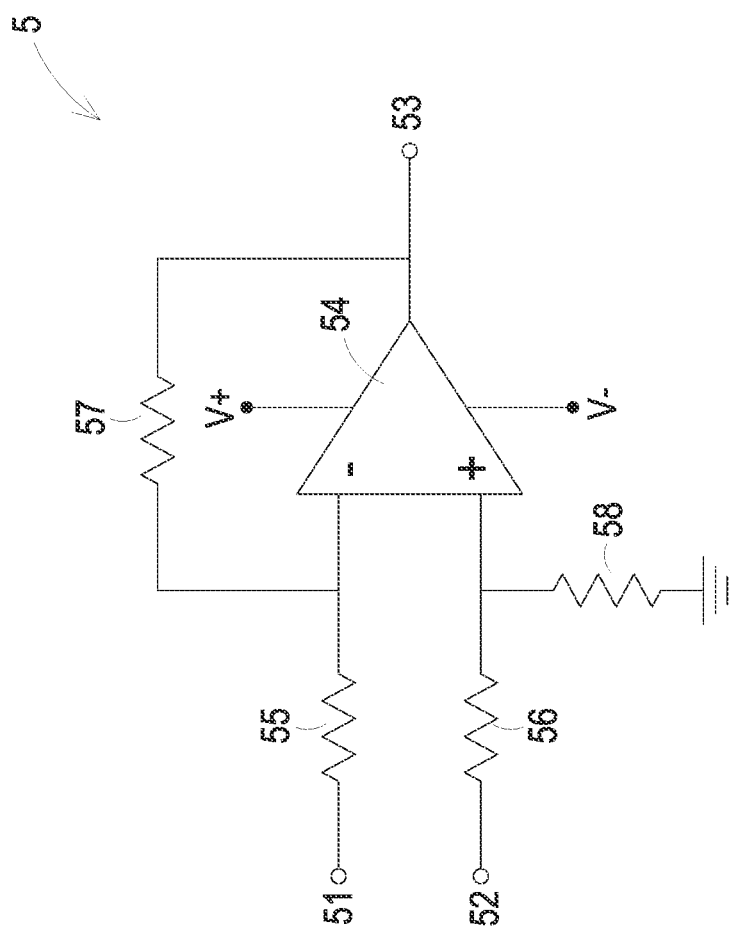
FIG. 10A is a circuit diagram illustrating an amplifier circuit of a first embodiment of the present disclosure, which is applied to the battery detection device.

In some embodiments, for detecting different orders of magnitude of the voltage variation quantity ΔVo between the second connection node B and the fourth connection node D by the protection circuit 4, the battery detection device includes an amplifier circuit to increase the voltage variation quantity ΔVo between the second connection node B and the fourth connection node D. FIG. 10A is a circuit diagram illustrating an amplifier circuit of a first embodiment of the present disclosure, which is applied to the battery detection device. As shown in FIG. 10A, the amplifier circuit 5 includes a first input terminal 51, a second input terminal 52, an output terminal 53, a first amplifier 54, a first amplifier resistor 55, a second amplifier resistor 56, a third amplifier resistor 57 and a fourth amplifier resistor 58. The first input terminal 51 is connected with the second connection node B. The second input terminal 52 is connected with the fourth connection node D. The output terminal 53 is connected with the protection circuit 4. The amplifier circuit 5 is connected between the electric bridge and the protection circuit 4, wherein the electric bridge is formed by the first resistor 31, the second resistor 32, the third resistor 33 and the fourth resistor 34. The negative input terminal of the first amplifier 54 is connected with the first input terminal 51 of the amplifier circuit 5 through the first amplifier resistor 55. The positive input terminal of the first amplifier 54 is connected with the second input terminal 52 of the amplifier circuit 5 through the second amplifier resistor 56. The output terminal of the first amplifier 54 is connected with the output terminal 53 of the amplifier circuit 5. The third amplifier resistor 57 is connected between the negative input terminal of the first amplifier 54 and the output terminal 53 of the amplifier circuit 5. The fourth amplifier resistor 58 is connected between the positive input terminal of the first amplifier 54 and the ground. In this embodiment, the gain of the amplifier circuit 5 is the impedance value of the third amplifier resistor 57 divided by the impedance value of the first amplifier resistor 55. The voltage operation equation of the output terminal 52 of the amplifier circuit 5 is calculated as $$V_{out} = \frac{Rf3}{Rf1}(V1 - V2),$$

wherein $V_{out}$ is the voltage of the output terminal 53 of the amplifier circuit 5, Rf1 is the impedance value of the first amplifier resistor 55, Rf3 is the impedance value of the third amplifier resistor 57, V1 is the voltage of the first input terminal 51 of the amplifier circuit 5 (i.e., the voltage of the second connection node B), and V2 is the voltage of the second input terminal 52 of the amplifier circuit 5 (i.e., the voltage of the fourth connection node D).

Figure 10B:
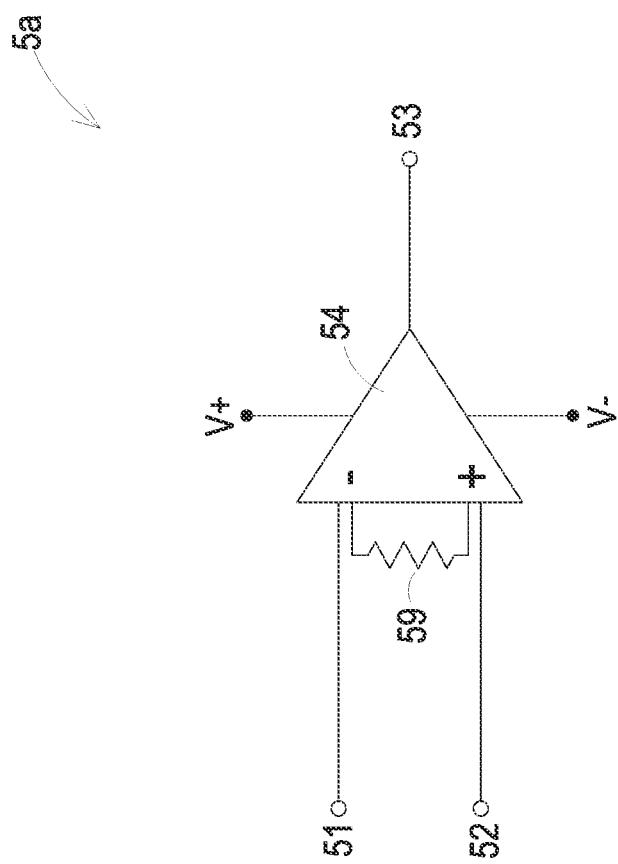
FIG. 10B is a circuit diagram illustrating an amplifier circuit of a second embodiment of the present disclosure, which is applied to the battery detection device.

FIG. 10B is a circuit diagram illustrating an amplifier circuit of a second embodiment of the present disclosure, which is applied to the battery detection device. As shown in FIG. 10B, the amplifier circuit 5a of this embodiment is similar to the amplifier circuit 5 of FIG. 10A. The amplifier circuit 5 of FIG. 10A includes four amplifier resistors. Compared to the amplifier circuit 5 of FIG. 10A, the amplifier circuit 5a of this embodiment only includes a single amplifier resistor for example a fifth amplifier resistor 59. The fifth amplifier resistor 59 is connected between the first input terminal 51 and the second input terminal 52. In this embodiment, the gain equation of the fifth amplifier resistor 59 is $$\text{gain} = \frac{49.4k}{R5} + 1,$$

wherein R5 is the impedance value of the fifth amplifier resistor 59.

Figure 10C:
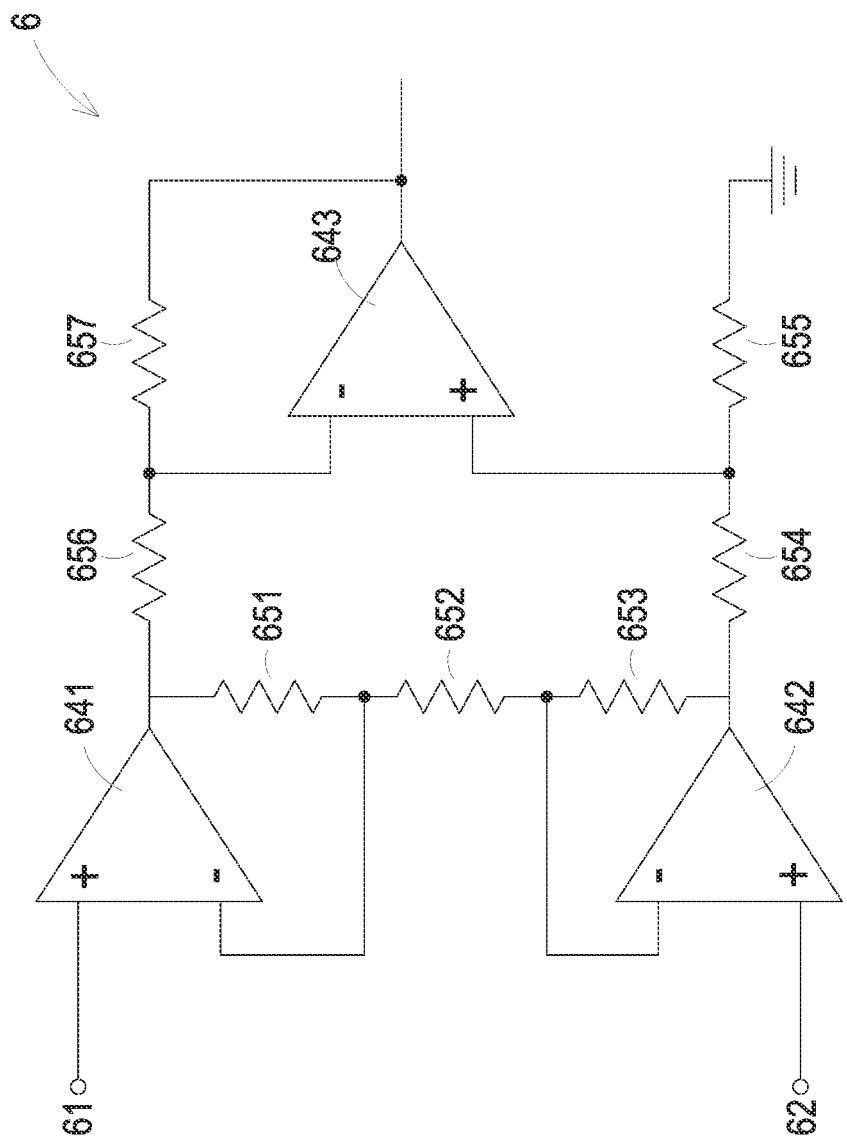
FIG. 10C is a circuit diagram illustrating an amplifier circuit of a third embodiment of the present disclosure, which is applied to the battery detection device.

FIG. 10C is a circuit diagram illustrating an amplifier circuit of a third embodiment of the present disclosure, which is applied to the battery detection device. As shown in FIG. 10C, the amplifier circuit 6 of this embodiment includes a first input terminal 61, a second input terminal 62, an output terminal 63, a second amplifier 641, a third amplifier 642, a fourth amplifier 643, a sixth amplifier resistor 651, a seventh amplifier resistor 652, an eighth amplifier resistor 653, a ninth amplifier resistor 654, a tenth amplifier resistor 655, an eleventh amplifier resistor 656 and a twelfth amplifier resistor 657. The first input terminal 61 is connected with the second connection node B. The second input terminal 62 is connected with the fourth connection node D. The output terminal 63 is connected with the protection circuit 4. The amplifier circuit 6 is connected between the electric bridge and the protection circuit 4, wherein the electric bridge is formed by the first resistor 31, the second resistor 32, the third resistor 33 and the fourth resistor 34.

The positive input terminal of the second amplifier 641 is connected with the first input terminal 61 of the amplifier circuit 6. The positive input terminal of the third amplifier 642 is connected with the second input terminal 62 of the amplifier circuit 6. The sixth amplifier resistor 651, the seventh amplifier resistor 652 and the eighth amplifier resistor 653 are connected between the output terminal of the second amplifier 641 and the output terminal of the third amplifier 642 in series. The connection between the sixth amplifier resistor 651 and the seventh amplifier resistor 652 is connected with the negative input terminal of the second amplifier 641. The connection between the seventh amplifier resistor 652 and the eighth amplifier resistor 653 is connected with the negative input terminal of the third amplifier 642. The ninth amplifier resistor 654 and the tenth amplifier resistor 655 are connected between the output terminal of the third amplifier 642 and the ground in series. The connection between the ninth amplifier resistor 654 and the tenth amplifier resistor 655 is connected with the positive input terminal of the fourth amplifier 643. The eleventh amplifier resistor 656 and the twelfth amplifier resistor 657 are connected between the output terminal of the second amplifier 641 and the output terminal 63 of the amplifier circuit 6 in series. The connection between the eleventh amplifier resistor 656 and the twelfth amplifier resistor 657 is connected with the negative input terminal of the fourth amplifier 643. The output terminal of the fourth amplifier 643 is connected with the output terminal 63 of the amplifier circuit 6. In this embodiment, the gain equation of the amplifier circuit 6 is $$\frac{V_{out}}{V2 - V1} = \left(1 + \frac{2R1}{Rgain}\right)\frac{R3}{R2},$$

wherein $V_{out}$ is the voltage of the output terminal 63 of the amplifier circuit 6, V1 is the voltage of the first input terminal 61 of the amplifier circuit 6 (i.e., the voltage of the second connection node B), V2 is the voltage of the second input terminal 62 of the amplifier circuit 6 (i.e., the voltage of the fourth connection node D), R1 is the impedance value of the sixth amplifier resistor 651, Rgain is the impedance value of the seventh amplifier resistor 652, R2 is the impedance value of the eleventh amplifier resistor 656, and R3 is the impedance value of the twelfth amplifier resistor 657.

Figure 11:
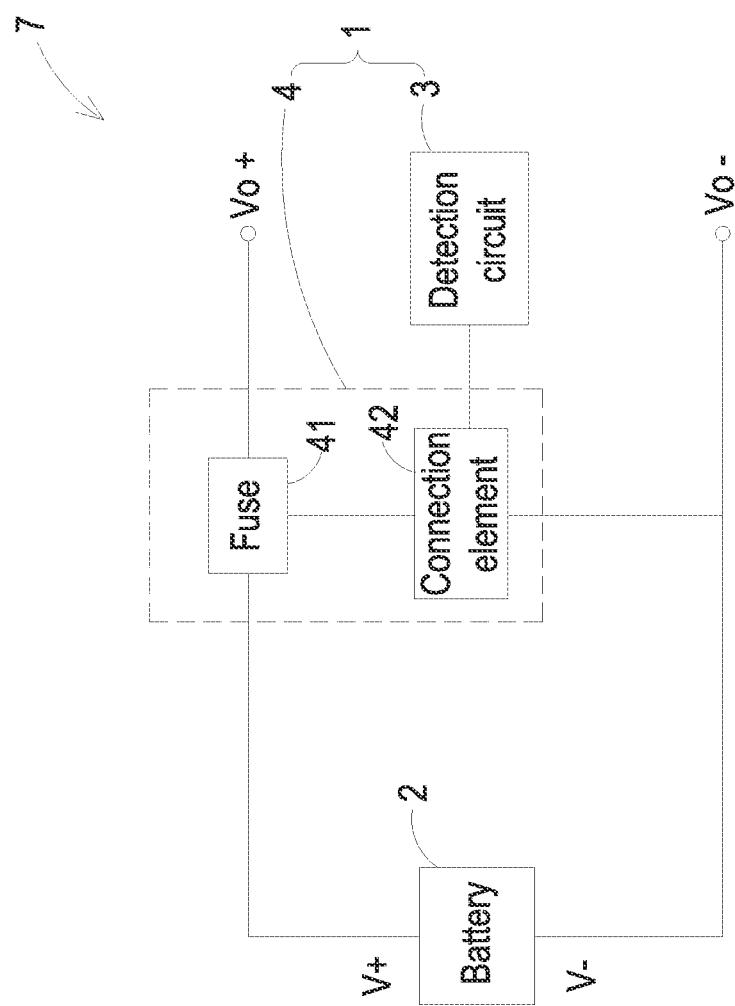
FIG. 11 is a circuit diagram illustrating a power supply system according to a first embodiment of the present disclosure, which is applied for the battery detection device.

FIG. 11 is a circuit diagram illustrating a power supply system according to a first embodiment of the present disclosure, which is applied for the battery detection device. In this embodiment, the battery detection device 1 of FIGS. 1 to 3 is applied to the power supply system 7 of FIG. 11. The battery detection device of the other embodiments can also be applied to the power supply system 7. As shown in FIG. 11, the power supply system 7 provides the power to the electronic device (not shown) through the positive output terminal Vo+ and the negative output terminal Vo−. The power supply system 7 includes the battery 2 and the battery detection device 1. As shown in FIG. 11, the block labeled as 3 is represented as the electric bridge (i.e., the detection circuit) formed by the first resistor 31, the second resistor 32, the third resistor 33 and the fourth resistor 34. In this embodiment, the protection circuit 4 includes a connection element 42 and a fuse 42. Preferably but not exclusively, the connection element 42 is a transistor. The connection element 42 is connected with the second connection node B and the fourth connection node D of the detection circuit 3 of the battery detection device 1. The connection element 42 receives the voltage variation quantity ΔVo produced between the second connection node B and the fourth connection node D. The fuse 41 is a triple-terminals fuse and connected between the connection element 42 and the load. The fuse 41 is connected between the battery 2 and the positive output terminal Vo+. When the voltage variation quantity ΔVo produced between the second connection node B and the fourth connection node D of the battery detection device 1 is greater than or equal to a starting voltage of the connection element 42, the connection element 42 is in a conduction-state. Consequently, the fuse 41 is burned, so that the protection circuit 4 is in the OFF state.

Figure 12:
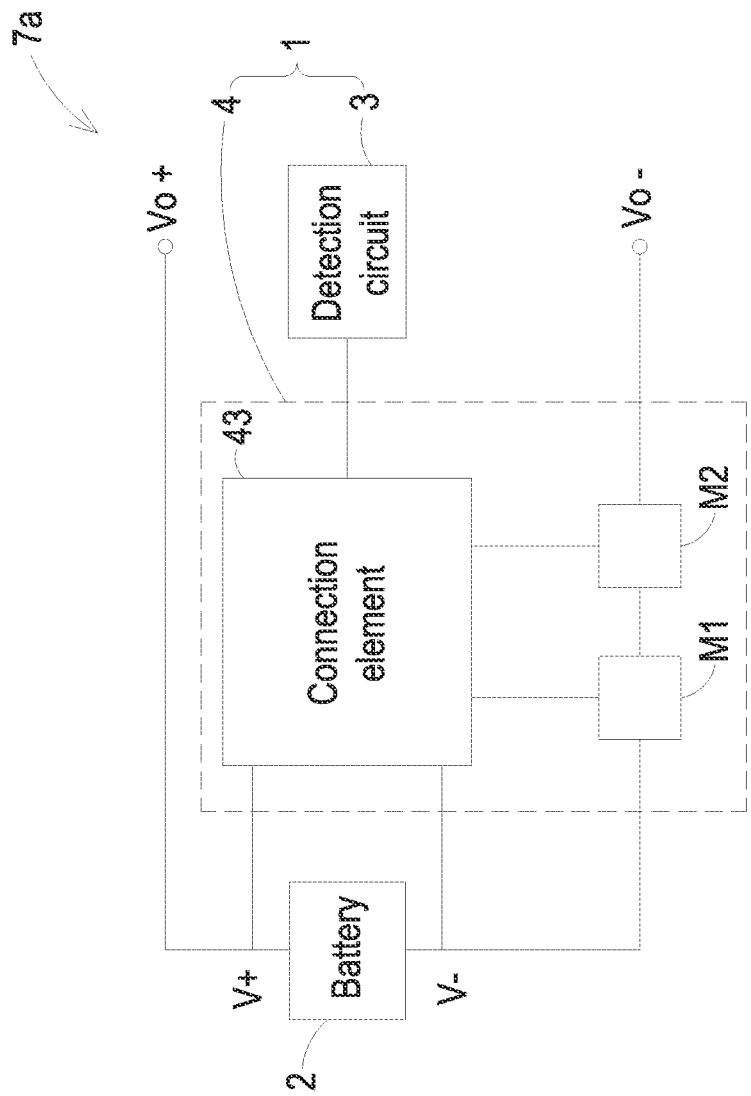
FIG. 12 is a circuit diagram illustrating a power supply system according to a second embodiment of the present disclosure, which is applied for the battery detection device.

FIG. 12 is a circuit diagram illustrating a power supply system according to a second embodiment of the present disclosure, which is applied for the battery detection device. In this embodiment, the battery detection device 1 of FIGS. 1 to 3 is applied to the power supply system 7a of FIG. 12. The battery detection device of the other embodiments can also be applied to the power supply system 7a. As shown in FIG. 12, the power supply system 7a of this embodiment provides the power to the electronic device (not shown) through the positive output terminal Vo+ and the negative output terminal Vo−. The power supply system 7a includes the battery 2 and the battery detection device 1. As shown in FIG. 12, the block labeled as 3 is represented as the electric bridge (i.e., the detection circuit) formed by the first resistor 31, the second resistor 32, the third resistor 33 and the fourth resistor 34. In this embodiment, the protection circuit 4 includes a connection element 43 and two transistors M1 and M2. In some embodiments, the transistor M1 is an over-current protection integrated circuit. The transistor M2 is an over-heat protection integrated circuit. Preferably but not exclusively, the connection element 42 is an integrated circuit. The connection element 43 is connected with the second connection node B and the fourth connection node D of the detection circuit 3 of the battery detection device 1, and connected with the battery 2. The connection element 42 receives the voltage variation quantity ΔVo produced between the second connection node B and the fourth connection node D and produces an inverse logic signal when the voltage variation quantity ΔVo is greater than or equal to the voltage threshold preset by the connection element 43. The two transistors M1 and M2 are connected between the battery 2 and the negative output terminal Vo− in series, and connected with the connection element 43. When at least one of the two transistors M1 and M2 receives the inverse logic signal produced by the connection element 43, so that the transistor receiving the inverse logic signal is in the OFF state and the protection circuit 4 is changed to the OFF state. Consequently, when the abnormal situation of the power supply system 7a is eliminated, the two transistors M1 and M2 can be switched, and the power supply system 7a is returned to the normal state rapidly.

Figure 13:
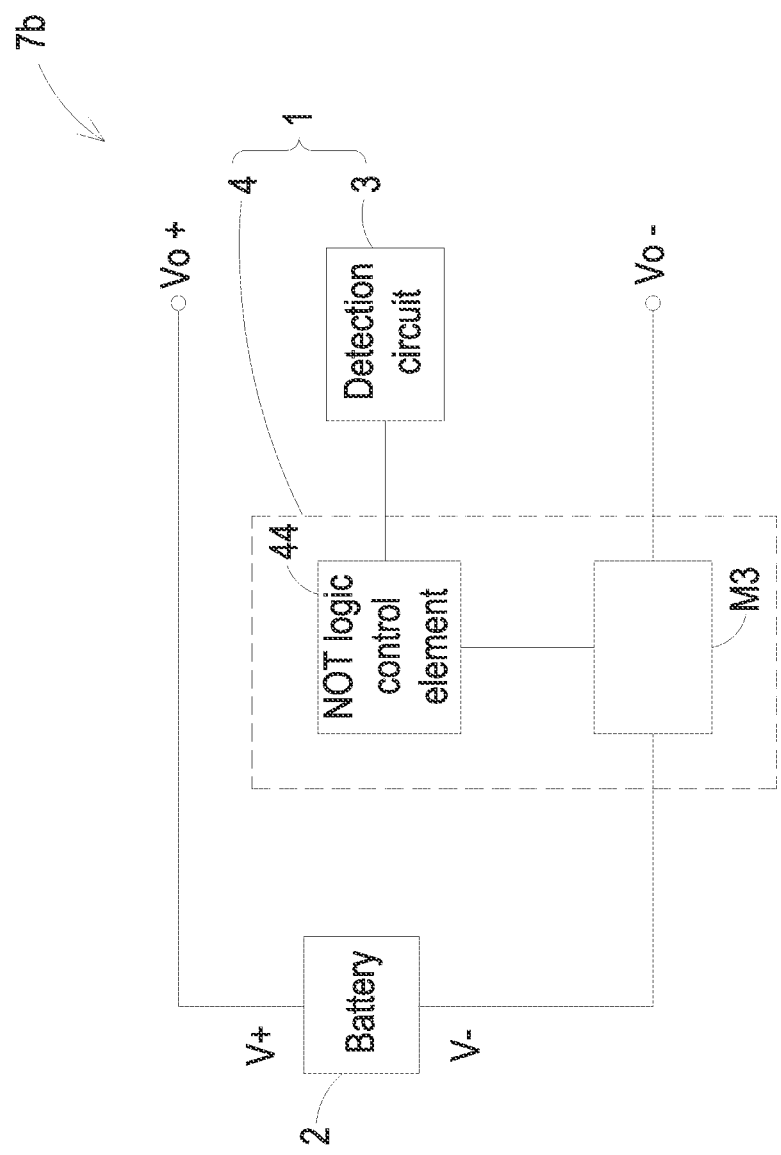
FIG. 13 is a circuit diagram illustrating a power supply system according to a third embodiment of the present disclosure, which is applied for the battery detection device.

FIG. 13 is a circuit diagram illustrating a power supply system according to a third embodiment of the present disclosure, which is applied for the battery detection device. In this embodiment, the battery detection device 1 of FIGS. 1 to 3 is applied to the power supply system 7b of FIG. 13. The battery detection device of the other embodiments can also be applied to the power supply system 7b. As shown in FIG. 13, the power supply system 7b of this embodiment provides the power to the electronic device (not shown) through the positive output terminal Vo+ and the negative output terminal Vo−. The power supply system 7b includes the battery 2 and the battery detection device 1. As shown in FIG. 13, the block labeled as 3 is represented as the electric bridge (i.e., the detection circuit) formed by the first resistor 31, the second resistor 32, the third resistor 33 and the fourth resistor 34. In this embodiment, the protection circuit 4 includes a transistor M3 and an inverse logic control element 44. The transistor M3 is connected between the battery 2 and the negative output terminal Vo−. The inverse logic control element 44 is connected with the second connection node B and the fourth connection node D of the detection circuit 3 of the battery detection device 1. The inverse logic control element 44 is connected between the detection circuit 3 and the transistor M3. When the voltage variation quantity ΔVo produced between the second connection node B and the fourth connection node D is greater than or equal to the starting voltage of the transistor M3, the transistor M3 is in the OFF state through the operation of the inverse logic control element 44, so that the battery 2 cannot provide the voltage to the load. Certainly, the components of the protection circuit 4 are not limited to the above elements. Any components capable of limit the battery 2 to provide the power to the load can be applied to the protection circuit 4, and are not redundantly described hereinafter.

From the above descriptions, the battery detection device of the present disclosure includes a first resistor, a second resistor, a third resistor, a fourth resistor and a protection circuit. According to the connection between the first resistor, the second resistor, the third resistor and the fourth resistor, the battery detection device changes the voltage variation quantity between the second connection node and the fourth connection node according to the impedance value variation of the first resistor when the battery is deformed. The working state of the protection circuit is controlled, so that the operation state of the battery is controlled. Consequently, the battery detection device controls the operation state of the battery according to the stress produced by the deformation of the battery in the deformation state. Compared to the conventional battery deformation detection method utilizing the pressure detector, the precision of the battery detection device is increased. The battery detection device does not need to set a threshold for an abnormal signal. The battery detection device is valid when the variation of the temperature difference is increased. Moreover, compared to the conventional battery deformation detection method utilizing the capacitance pressure detector, the battery detection device has advantages of increasing precision, being calibrated easily, manipulating easily, decreasing cost and decreasing the assembling tolerance.

While the disclosure has been described in terms of what is presently considered to be the most practical and preferred embodiments, it is to be understood that the disclosure needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A battery detection device, applied to a battery comprising a positive terminal and a negative terminal and providing a power to a load, the battery detection device comprising:

a detection circuit disposed on the battery and configured to produce a first impedance value variation quantity according to a deformation of the battery, wherein the detection circuit comprises a first connection node, a second connection node, a third connection node and a fourth connection node, the first connection node and the third connection node are electrically connected with the positive terminal and the negative terminal, respectively, for receiving the power provided by the battery, a voltage variation quantity is produced between the second connection node and the fourth connection node at least according to the first impedance value variation quantity, wherein the detection circuit comprises a first resistor, a second resistor, a third resistor and a fourth resistor, a impedance value of the first resistor produces the first impedance value variation quantity according to the deformation of the battery, the second resistor and the first resistor are connected with each other to form the first connection node, the third resistor and the first resistor are connected with each other to form the second connection node, one end of the fourth resistor and the third resistor are connected with each other to form the third connection node, the other end of the fourth resistor and the second resistor are connected with each other to form the fourth connection node, wherein the first resistor is extended in a first direction and disposed on the battery, the impedance value of the first resistor produces the first impedance value variation quantity according to the deformation of the battery in the first direction, the third resistor is extended in a second direction and disposed on the battery, the impedance value of the third resistor produces a second impedance value variation quantity according to the deformation of the battery in the second direction, wherein the voltage variation quantity between the second connection node and the fourth connection node is produced according to the first impedance value variation quantity and/or the second impedance value variation quantity; and a protection circuit connected with the second connection node and the fourth connection node, wherein the protection circuit is in an ON state when the voltage variation quantity is greater than or equal to a cut-off voltage, and the protection circuit is in an OFF state when the voltage variation quantity is less than the cut-off voltage, so that an operation state of the battery is changed accordingly.

2. The battery detection device according to claim 1, wherein when the first impedance value variation quantity of the first resistor is not equal to zero and the voltage variation quantity between the second connection node and the fourth connection node is greater than or equal to the cut-off voltage, the protection circuit is in the ON state so that the battery cannot provide the power to the load.

3. The battery detection device according to claim 2, wherein when the first impedance value variation quantity of the first resistor is equal to zero and the voltage variation quantity between the second connection node and the fourth connection node is equal to zero, the protection circuit is in the OFF state, so that the battery provides the power to the load continuously.

4. The battery detection device according to claim 1, wherein when the battery is in a normal state, a first ratio between the impedance value of the first resistor and the impedance value of the third resistor is equal to a second ratio between the impedance value of the second resistor and the impedance value of the fourth resistor.

5. The battery detection device according to claim 1, wherein the battery detection device comprises an amplifier circuit, the amplifier circuit comprises a first input terminal, a second input terminal and an output terminal, the first input terminal is connected with the second connection node, the second input terminal is connected with the fourth connection node, the output terminal is connected with the protection circuit, the voltage variation quantity between the second connection node and the fourth connection node is increased by the amplifier circuit, so that the voltage variation quantity is transmitted to the protection circuit.

6. The battery detection device according to claim 1, wherein the protection circuit comprises a connection element connected with the second connection node and the fourth connection node for receiving the voltage variation quantity.

7. The battery detection device according to claim 6, wherein the protection circuit comprises a fuse connected between the connection element and the load, wherein when the voltage variation quantity is greater than or equal to a starting voltage of the connection element, the connection element is in a conduction-state and the fuse is burned, so that the protection circuit is changed to the OFF state.

8. The battery detection device according to claim 6, wherein the protection circuit comprises a transistor connected between the connection element and the load, wherein the connection element receives the voltage variation quantity and provides an inverse logic signal to the transistor, so that the transistor is turned off and the protection circuit is in the OFF state.

9. A battery detection device, applied to a battery comprising a positive terminal and a negative terminal and providing a power to a load, the battery detection device comprising:

a detection circuit disposed on the battery and configured to produce a first impedance value variation quantity according to a deformation of the battery, wherein the detection circuit comprises a first connection node, a second connection node, a third connection node and a fourth connection node, the first connection node and the third connection node are electrically connected with the positive terminal and the negative terminal, respectively, for receiving the power provided by the battery, a voltage variation quantity is produced between the second connection node and the fourth connection node at least according to the first impedance value variation quantity, wherein the detection circuit comprises a first resistor, a second resistor, a third resistor and a fourth resistor, a impedance value of the first resistor produces the first impedance value variation quantity according to the deformation of the battery, the second resistor and the first resistor are connected with each other to form the first connection node, the third resistor and the first resistor are connected with each other to form the second connection node, one end of the fourth resistor and the third resistor are connected with each other to form the third connection node, the other end of the fourth resistor and the second resistor are connected with each other to form the fourth connection node, wherein the first resistor comprises a first sub resistor and a second sub resistor, the first sub resistor is extended in a first direction and disposed on the battery, the second sub resistor is extended in a second direction and disposed on the battery, an impedance value of the first sub resistor produces a first sub impedance value variation quantity according to the deformation of the battery in the first direction, an impedance value of the second sub resistor produces a second sub impedance value variation quantity according to the deformation of the battery in the second direction, the first sub impedance value variation quantity and the second sub impedance value variation quantity form the first impedance value variation quantity collectively; and a protection circuit connected with the second connection node and the fourth connection node, wherein the protection circuit is in an ON state when the voltage variation quantity is greater than or equal to a cut-off voltage, and the protection circuit is in an OFF state when the voltage variation quantity is less than the cut-off voltage, so that an operation state of the battery is changed accordingly.

10. The battery detection device according to claim 9, wherein when the first impedance value variation quantity of the first resistor is not equal to zero and the voltage variation quantity between the second connection node and the fourth connection node is greater than or equal to the cut-off voltage, the protection circuit is in the ON state so that the battery cannot provide the power to the load.

11. The battery detection device according to claim 9, wherein when the battery is in a normal state, a first ratio between the impedance value of the first resistor and the impedance value of the third resistor is equal to a second ratio between the impedance value of the second resistor and the impedance value of the fourth resistor.

12. The battery detection device according to claim 11, wherein when the first impedance value variation quantity of the first resistor is equal to zero and the voltage variation quantity between the second connection node and the fourth connection node is equal to zero, the protection circuit is in the OFF state, so that the battery provides the power to the load continuously.

13. The battery detection device according to claim 9, wherein the battery detection device comprises an amplifier circuit, the amplifier circuit comprises a first input terminal, a second input terminal and an output terminal, the first input terminal is connected with the second connection node, the second input terminal is connected with the fourth connection node, the output terminal is connected with the protection circuit, the voltage variation quantity between the second connection node and the fourth connection node is increased by the amplifier circuit, so that the voltage variation quantity is transmitted to the protection circuit.

14. The battery detection device according to claim 9, wherein the protection circuit comprises a connection element connected with the second connection node and the fourth connection node for receiving the voltage variation quantity.

15. The battery detection device according to claim 14, wherein the protection circuit comprises a fuse connected between the connection element and the load, wherein when the voltage variation quantity is greater than or equal to a starting voltage of the connection element, the connection element is in a conduction-state and the fuse is burned, so that the protection circuit is changed to the OFF state.

16. The battery detection device according to claim 14, wherein the protection circuit comprises a transistor connected between the connection element and the load, wherein the connection element receives the voltage variation quantity and provides an inverse logic signal to the transistor, so that the transistor is turned off and the protection circuit is in the OFF state.

* * * * *